(12) United States Patent
Yuan et al.

(10) Patent No.: US 9,456,493 B2
(45) Date of Patent: Sep. 27, 2016

(54) TOUCH-SENSOR STRUCTURE AND MANUFACTURING METHOD THEREOF

(71) Applicant: TPK Touch Solutions (Xiamen) Inc., Xiamen (CN)

(72) Inventors: Qiong Yuan, Xinyu (CN); Jing Yu, Xiamen (CN); Hongyan Lian, Xiamen (CN); Pingping Huang, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 86 days.

(21) Appl. No.: 14/064,183

(22) Filed: Oct. 27, 2013

(65) Prior Publication Data

US 2014/0144689 A1    May 29, 2014

(30) Foreign Application Priority Data

Oct. 29, 2012   (CN) .......................... 2012 1 0433622

(51) Int. Cl.
| | |
|---|---|
| *G06F 3/041* | (2006.01) |
| *H05K 1/02* | (2006.01) |
| *G06F 3/044* | (2006.01) |
| *H05K 1/09* | (2006.01) |

(52) U.S. Cl.
CPC ............. *H05K 1/0289* (2013.01); *G06F 3/044* (2013.01); *G06F 2203/04103* (2013.01); *G06F 2203/04111* (2013.01); *H05K 1/09* (2013.01); *H05K 2201/0108* (2013.01); *H05K 2201/0326* (2013.01); *H05K 2201/09036* (2013.01); *Y10T 29/49155* (2015.01)

(58) Field of Classification Search
CPC ................... G06F 3/041; G06F 3/044; G06F 2203/04103; G06F 2203/0411; H05K 1/0289; H05K 1/09; H05K 2201/0108; H05K 2201/0326; H05K 2201/09036; Y10T 29/49155
USPC ........................................................ 345/173
See application file for complete search history.

(56) References Cited

U.S. PATENT DOCUMENTS

| | | | | |
|---|---|---|---|---|
| 5,275,974 A | * | 1/1994 | Ellul ................. | H01L 29/66181 257/535 |
| 2006/0092139 A1 | * | 5/2006 | Sharma ......................... | 345/173 |
| 2007/0140614 A1 | * | 6/2007 | Kim et al. ...................... | 385/18 |
| 2011/0232947 A1 | * | 9/2011 | Fan ................................ | 174/255 |

FOREIGN PATENT DOCUMENTS

| | | |
|---|---|---|
| CN | 101763186 B | 10/2011 |
| CN | 102346614 A | 2/2012 |

* cited by examiner

*Primary Examiner* — Mark Regn
(74) *Attorney, Agent, or Firm* — Cooper Legal Group, LLC (57) ABSTRACT

A touch-sensor structure includes a substrate having a plurality of grooves formed thereon. A plurality of first axial electrode strips are disposed in the grooves individually. A plurality of second axial electrode strips are disposed on the substrate and intersect with the first axial electrode strips. An insulating layer fills in the grooves and is disposed at the intersections of the first and second axial electrode strips. Furthermore, the manufacturing method of the touch-sensor structure is provided. The insulating layer is disposed in the grooves of the substrate without a protuberant height on the substrate. Therefore, it can overcome a breakage issue in conventional conductive bridges.

19 Claims, 6 Drawing Sheets

TOUCH-SENSOR STRUCTURE AND MANUFACTURING METHOD THEREOF

BACKGROUND OF THE DISCLOSURE

This Application claims priority of the People's Republic of China Patent Application No. 201210433622.4, filed on Oct. 29, 2012, the entirety of which is incorporated by reference herein.

FIELD OF THE INVENTION

The present disclosure relates to touch device technology, and in particular, to a touch-sensor structure and a manufacturing method thereof.

DESCRIPTION OF THE RELATED ART

Recently, touch panel techniques have been developed to be a main input method and have been popularly applied in various electronic products, such as mobile phones, personal digital assistants (PDA), and handheld personal computers. Touch-sensing elements of a touch panel may include a plurality of sensing electrodes arranged to a plurality of columns and a plurality of sensing electrodes arranged to a plurality of rows. An insulating part is disposed at a location of the intersection of the sensing electrodes arranged in columns and the sensing electrodes arranged in rows to avoid the issue of shorts occurring between the sensing electrodes arranged in columns and the sensing electrodes arranged in rows.

In conventional touch panels, the sensing electrodes arranged in columns comprise a plurality of conductive units connected with each other, and the sensing electrodes arranged in rows comprise a plurality of conductive units separated from each other. The conductive units separated from each other are electrically connected to each other by a conventional conductive bridge structure disposed across the insulating part.

However, the conventional conductive bridge structure necessitates climbing across the insulating part to electrically connect two adjacent conductive units with each other. Thus, there is an issue of breakage or cracks forming in the conventional conductive bridge structure at the location of the conventional conductive bridge structure having a difference in height due to the climb across the insulating part. Such breakage or cracks can cause the electrical connection of the conventional conductive bridge structure to fail, or worse. Thus, the sensing electrodes of the conventional touch panels have an open issue or an abnormal resistivity. In addition, the ability of the sensing electrodes to resist static is poor. Furthermore, the touch-sensing function of conventional touch panels is often poor, or fails altogether.

SUMMARY OF THE DISCLOSURE

According to an embodiment of the present disclosure, a touch-sensor structure and a manufacturing method thereof are provided to overcome the aforementioned problems associated with conventional touch panels. In the touch-sensor structure, an insulating layer is disposed in a groove of a substrate, and thus does not have a protuberant height. Therefore, sensing electrodes of the touch-sensor structure do not require climbing across the insulating layer having the protuberant height. The aforementioned problems associated with conventional touch panels occur due to the conventional conductive bridge structures necessitating climbing across the conventional insulating part with a protuberant height, and these problems are overcome by the touch-sensor structure of the present disclosure.

The touch-sensor structure comprises a substrate having a plurality of grooves disposed on a surface of the substrate. A plurality of first axial electrode strips are disposed in the grooves of the substrate individually. A plurality of second axial electrode strips are disposed on the surface of the substrate, intersecting with the first axial electrode strips. Moreover, an insulating layer fills in the grooves and is disposed at the intersections of the first axial electrode strips and the second axial electrode strips for isolating the plurality of first axial electrode strips from the plurality of second axial electrode strips.

The manufacturing method of a touch-sensor structure is provided. The method comprises forming a plurality of grooves on a surface of a substrate; forming a plurality of first axial electrode strips individually located in the grooves; filling the grooves with an insulating layer; forming a plurality of second axial electrode strips on the surface of the substrate to intersect with the first axial electrode strips, wherein the insulating layer is located at the intersections of the first axial electrode strips and the second axial electrode strips for isolating the plurality of first axial electrode strips from the plurality of second axial electrode strips.

According to the embodiments of the present disclosure, the first axial electrode strips are disposed in the grooves of the substrate and the grooves of the substrate are filled with the insulating layer. The insulating layer fills in the grooves to have a height which can make the electrical connection structures for connecting any two adjacent conductive units of the second axial electrode strips to be flatly disposed on the insulating layer. Thus, the electrical connection structures can connect any two adjacent conductive units without climbing onto the insulating layer having the protuberant height. Therefore, it can avoid the issues of breakage or cracking, as occur in the conventional conductive bridge structures due to the necessity of climbing across the insulating part having the protuberant height.

DETAILED DESCRIPTION OF THE EMBODIMENTS

The following description is made for the purpose of illustrating the general principles of the invention and should not be taken in a limiting sense. The scope of the invention is determined by reference to the appended claims.

Figure 1:
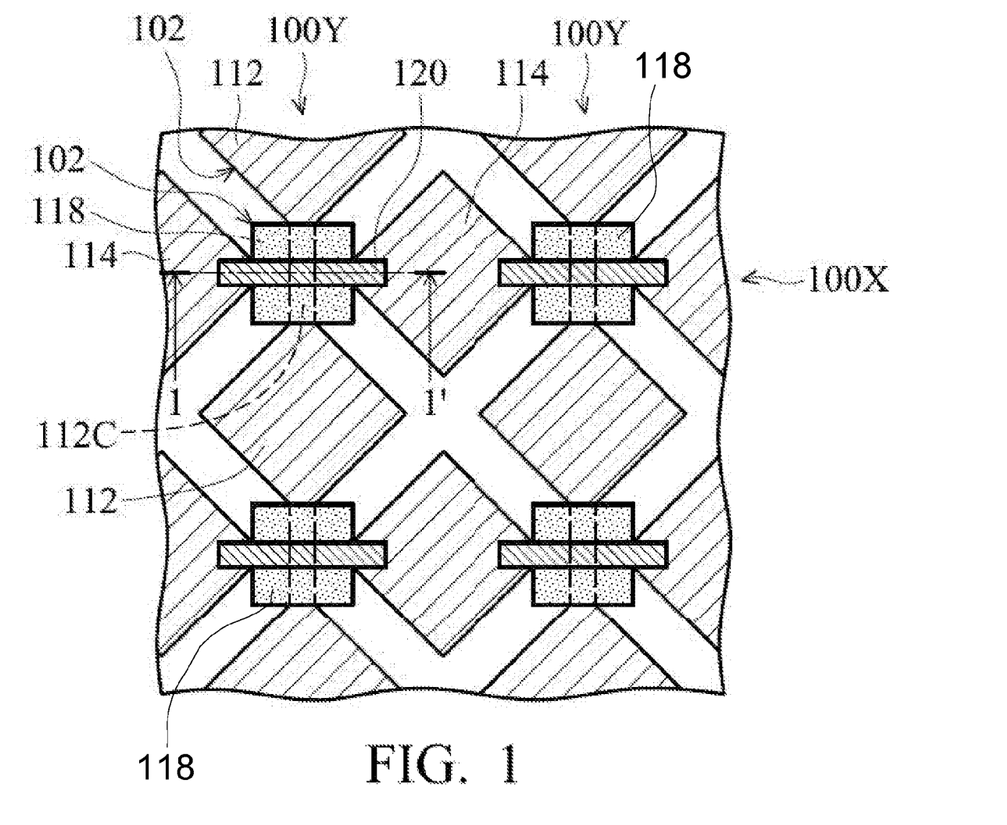
FIG. 1 shows an illustrative plane view of a part of a touch-sensor structure according to an embodiment of the present disclosure.
Figure 2:
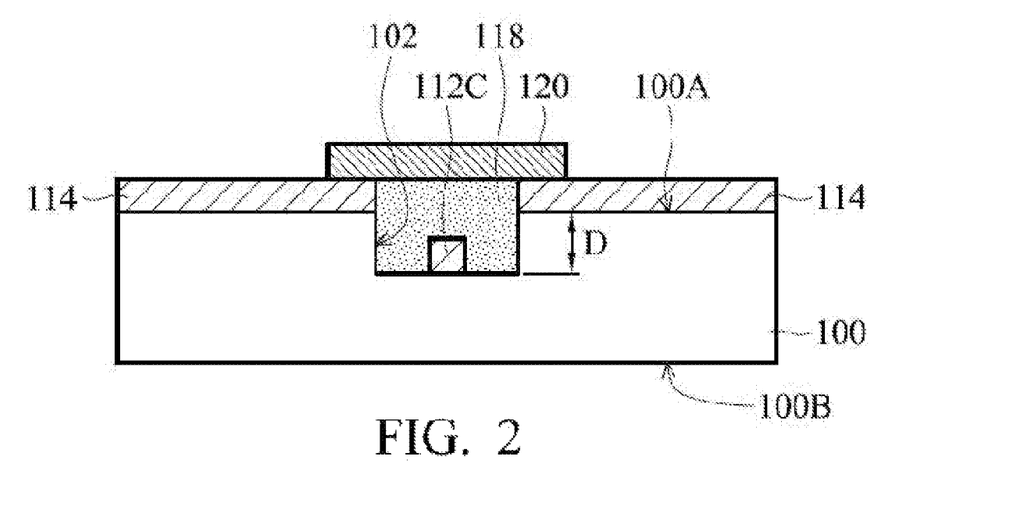
FIG. 2 shows an illustrative cross section of a touch-sensor structure along a cross section line 1-1' of FIG. 1 according to an embodiment of the present disclosure.

Referring to FIG. 1, a plane view of a part of a touch-sensor structure according to an embodiment of the present disclosure is shown. Then, referring to FIG. 2, a cross section of a touch-sensor structure along the cross section line 1-1' of FIG. 1 according to an embodiment of the present disclosure is shown. As shown in FIG. 1 and FIG. 2, the touch-sensor structure comprises a substrate 100, a plurality of first axial electrode strips 100Y, a plurality of second axial electrode strips 100X and an insulating layer 118. A plurality of grooves 102 are formed on a first surface 100A of the substrate 100. The first axial electrode strips 100Y are disposed in the grooves 102 of the substrate 100 individually. The second axial electrode strips 100X are disposed on the first surface 100A of the substrate 100 and arranged to intersect with the first axial electrode strips 100Y. The insulating layer 118 fills in the grooves 102 and is disposed at the intersections of the first axial electrode strips 100Y and the second axial electrode strips 100X for electronically isolating the plurality of first axial electrode strips 100Y from the plurality of second axial electrode strips 100X.

Referring to FIG. 1, from a top view, the first axial electrode strips 100Y are arranged along a first axis, for example the Y-axis. Each of the first axial electrode strips 100Y includes a plurality of first conductive units 112 and a plurality of first connection lines 112C for electrically connecting any two adjacent first conductive units 112 together along the first axis. The second axial electrode strips 100X are arranged along a second axis, for example the X-axis. Each of the plurality of second axial electrode strips 100X includes a plurality of second conductive units 114 and a plurality of jumpers 120 for electrically connecting any two adjacent second conductive units 114 together. The first axial electrode strips 100Y are arranged to intersect with the second axial electrode strips 100X, preferably the first axial electrode strips 100Y and the second axial electrode strips 100X are perpendicular to each other, but are not limited thereto.

Moreover, the insulating layer 118 is disposed between the first axial electrode strips 100Y and the second axial electrode strips 100X. Actually, the insulating layer 118 is disposed in the second compartment portion 102B a groove 102 and covers the first connection line 112C. Specifically, the insulating layer 118 is disposed between the first connection lines 112C of the first axial electrode strips 100Y and the jumpers 120 of the second axial electrode strips 100X for electronically isolating the first connection lines 112C and the jumpers 120 to avoid shorts occurring at the intersections of the first axial electrode strips 100Y and the second axial electrode strips 100X.

Referring to FIG. 2, the substrate 100 has a second surface 100B opposite to the first surface 100A. The second surface 100B of the substrate 100 can be used as a touch side of a touch panel. The substrate 100 may be a glass substrate or a plastic substrate. The substrate 100 can be used as a cover lens of the touch panel. In another embodiment, the substrate 100 may be used as a carrier for supporting the first axial electrode strips 100Y and the second axial electrode strips 100X. A cover lens (not shown) is further provided to cover the first axial electrode strips 100Y and the second axial electrode strips 100X. The cover lens is used as a touch side of the touch panel. There is a plurality of grooves 102 formed on the first surface 100A of the substrate 100. However, for clarifying the embodiments in drawings, only one groove 102 is shown in FIG. 2. Since the groove 102 is formed corresponding to the location of the first axial electrode strips 100Y and the insulating layer 118 shown in FIG. 1, actually, there is a plurality of grooves 102 formed on the first surface 100A of the substrate 100.

Moreover, from a top view, the design requirement of the grooves 102 is just for accommodating only the first axial electrode strips 100Y and the insulating layer 118. Therefore, in an embodiment, the grooves 102 have a plane pattern the same as, and overlapping with, the plane pattern of the first axial electrode strips 100Y and the plane pattern of the insulating layer 118. The area of the grooves 102 may be equal to or greater than the sum of the area of the first axial electrode strips 100Y and the area of the insulating layer 118. Moreover, in an embodiment, a cross-sectional shape of the each groove 102 may be a rectangle. Each groove 102 in the substrate 100 has a depth D of about 1 μm. However, the plane pattern and the cross-sectional shape of the grooves 102 are not limited to the shapes described above.

In the embodiment, the plurality of first conductive units 112 and the plurality of first connection lines 112C of the first axial electrode strip 100Y are disposed in the grooves 102. The second conductive units 114 of the second axial electrode strips 100X are disposed on the first surface 100A of the substrate 100. The insulating layer 118 fills in the grooves 102 and is disposed on the first connection lines 112C. The insulating layer 118 fills in the grooves 102 to have a height, level with the height of the second conductive units 114 of the second axial electrode strips 100X. Thus, the height of the insulating layer 118 is level with the surface of the second conductive units 114 opposite to another surface of the second conductive units 114 facing the substrate 100.

The jumpers 120 are disposed on the insulating layer 118 and extend onto a part of the second conductive units 114 for electrically connecting any two adjacent second conductive units 114 together. According to the embodiments of the present disclosure, the jumpers 120 can electrically connect any two adjacent second conductive units 114 together without climbing across the insulating layer 118 having a protuberant height. All the jumpers 120 are located on the same level, thus the jumpers 120 do not have the problems of breakage or cracking which are produced due to the jumpers climbing onto the insulating layer 118 having the protuberant height. Furthermore, it can enhance uniformity of resistivity, a resistance to static, and the reliability of the touch-sensor structures in the touch panel.

A manufacturing method of the touch-sensor structure of FIG. 2 comprises the steps as follows: forming a plurality of grooves on a surface of a substrate; forming a plurality of first axial electrode strips individually located in the grooves of the substrate; filling the grooves of the substrate with an insulating layer; and forming a plurality of second axial electrode strips on the surface of the substrate to intersect with the first axial electrode strips, wherein the insulating layer is located at the intersections of the first axial electrode strips and the second axial electrode strips for isolating the plurality of first axial electrode strips from the plurality of second axial electrode strips. The manufacturing method of the embodiment of the present disclosure is described below in detail with references made to the accompanying drawings.

Figure 3A:
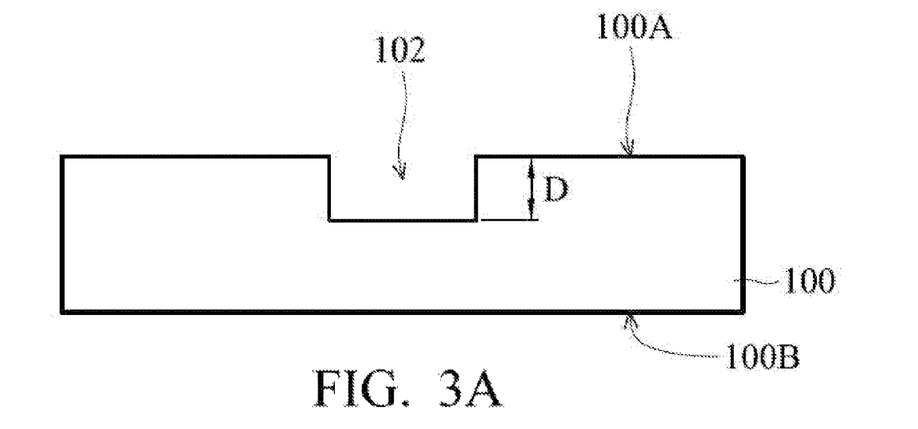
FIGS. 3A-3C show illustrative cross sections of intermediate stages of forming the touch-sensor structure of FIG. 2 according to an embodiment of the present disclosure.
Figure 3B:
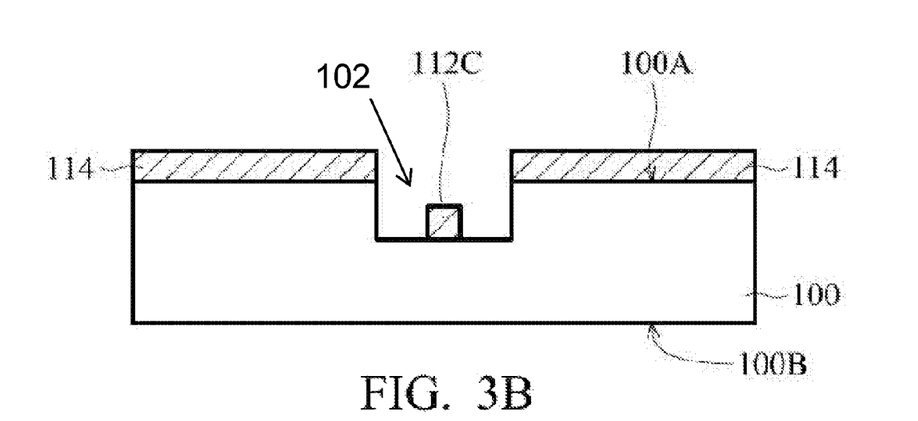
Figure 3C:
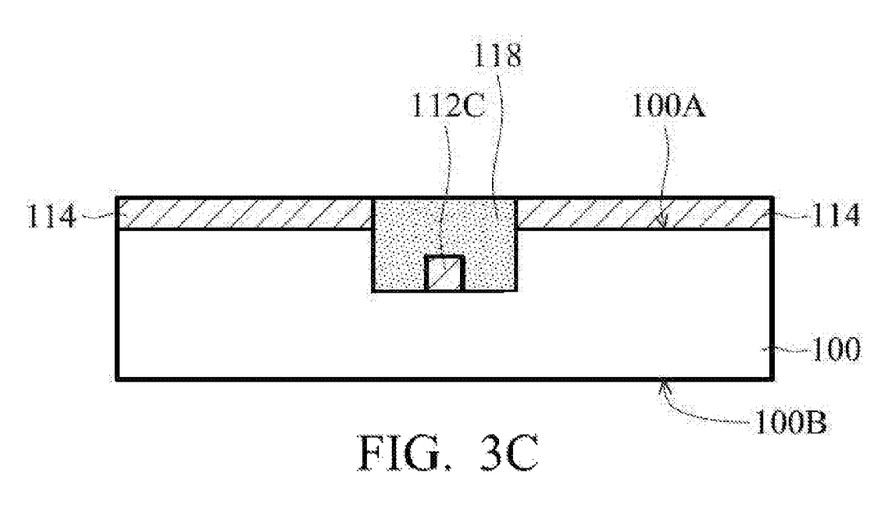

FIGS. 3A-3C are cross sections of the intermediate stages of forming the touch-sensor structure of FIG. 2, according to an embodiment of the present disclosure. Referring to FIG. 3A, firstly, a plurality of grooves 102 is formed on the first surface 100A of the substrate 100. For simplifying the drawings, only one groove 102 is shown in FIG. 3A as a representative. In an embodiment, the substrate 100 is a glass substrate. The grooves 102 can be formed by a micro-etching process or a laser-engraving process. In another embodiment, the substrate 100 is a plastic substrate. The grooves 102 can be formed by an imprinting process.

Referring to FIG. 3B, the plurality of first conductive units 112 and the plurality of first connection lines 112C for electrically connecting any two adjacent first conductive units 112 of the first axial electrode strip 100Y are formed in the grooves 102 of the substrate 100. The first conductive units 112 and the first connection lines 112C can be formed as an integral whole. Each of the second axial electrode strips 100X includes the plurality of second conductive units 114. The first axial electrode strips 100Y and the second conductive units 114 of the second axial electrode strips 100X can be formed simultaneously by the same steps or respectively formed by a different process. In the embodiment, the first axial electrode strips 100Y and the second conductive units 114 are formed simultaneously by the same process, such as a deposition process, a photolithography process, and an etching process. The materials of the first axial electrode strips 100Y and the second conductive units 114 is a transparent conductive material, for example indium tin oxide (ITO), indium zinc oxide (IZO), aluminum zinc oxide (AZO), or another suitable transparent conductive material.

Referring to FIG. 3C, the grooves 102 of the substrate 100 are filled with an insulating layer 118. The insulating layer 118 fills in the grooves 102 to have a height, level with the height of the second conductive units 114 of the second axial electrode strips 100X. Thus, the height of the insulating layer 118 is level with the surface of the second conductive units 114 which is opposite to another surface of the second conductive units 114 facing the substrate 100. Moreover, the insulating layer 118 is formed on the plurality of first connection lines 112C of the first axial electrode strips 100Y. In an embodiment, the material of the insulating layer 118 is, for example, a photosensitive polyimide (PI). The insulating layer 118 can be formed by a coating process combined with a photolithography process, or by a printing process.

Next, the jumpers 120 of the second axial electrode strips 100X are formed on the insulating layer 118 for electrically connecting any two adjacent second conductive units 114 together. Each of the jumpers 120 may extend onto two adjacent second conductive units 114. Thus, the touch-sensor structure of FIG. 2 is completed.

In the embodiment, the material of the jumpers 120 may be a metal or a transparent conductive material such as indium tin oxide (ITO). The jumpers 120 can be formed by a deposition process, a photolithography process, and an etching process.

The insulating layer 118 is formed at the intersections of the first axial electrode strips 100Y and the second axial electrode strips 100X. Actually, the insulating layer 118 is formed between the first connection lines 112C and the jumpers 120 for isolating the first connection lines 112C and the jumpers 120. Furthermore, the insulating layer 118 is located between any two adjacent second conductive units 114.

Figure 4:
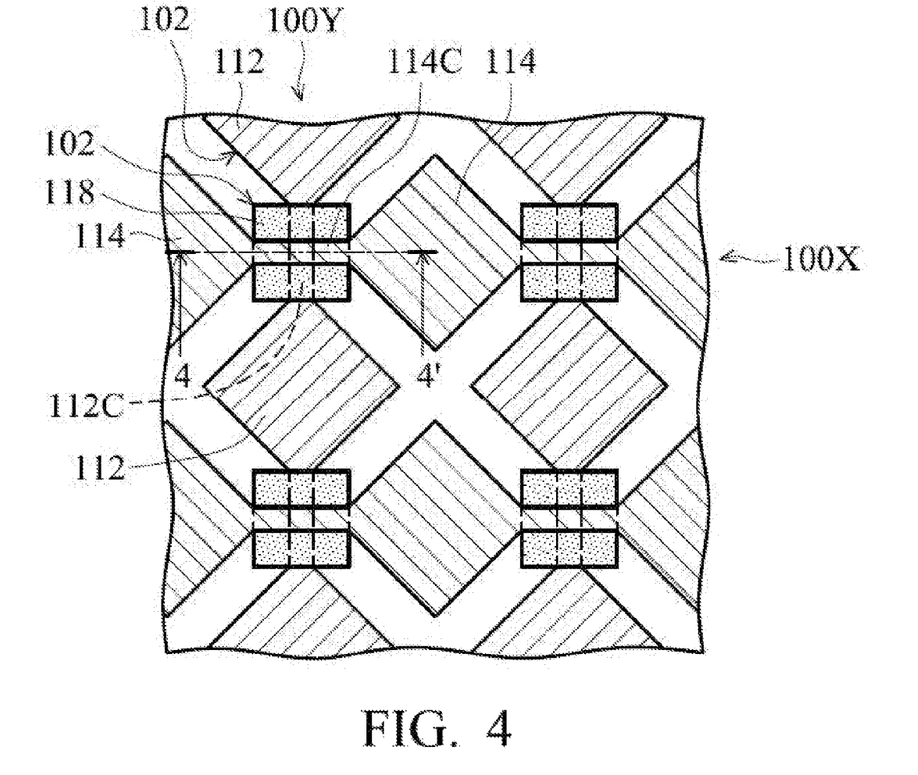
FIG. 4 shows an illustrative plane view of a part of a touch-sensor structure according to another embodiment of the present disclosure.
Figure 5:
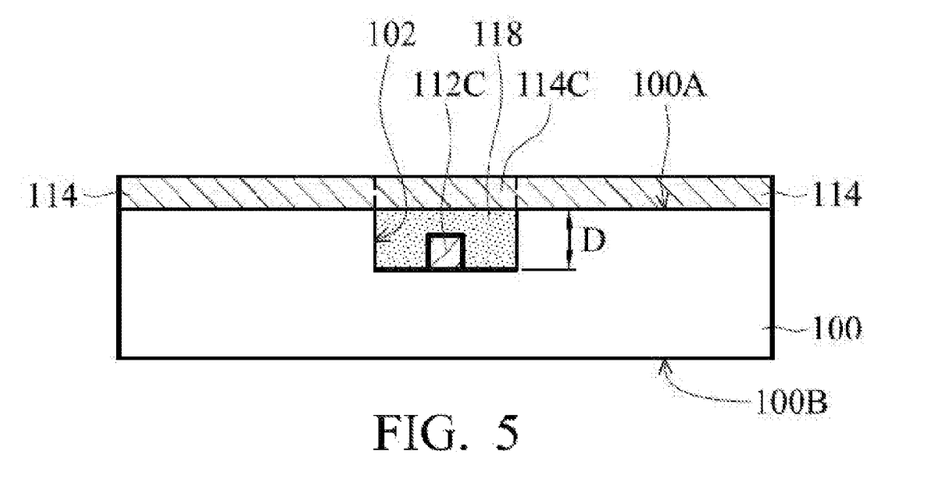
FIG. 5 shows an illustrative cross section of a touch-sensor structure along the cross section line 4-4' of FIG. 4 according to an embodiment of the present disclosure.

FIG. 4 shows a plane view of a part of a touch-sensor structure according to another embodiment of the present disclosure. FIG. 5 shows a cross section of the touch-sensor structure along the cross section line 4-4' of FIG. 4 according to an embodiment of the present disclosure. Referring to FIG. 4 and FIG. 5, the touch-sensor structure comprises a substrate 100, a plurality of first axial electrode strips 100Y, a plurality of second axial electrode strips 100X and an insulating layer 118. A plurality of grooves 102 are formed on a first surface 100A of the substrate 100. The first axial electrode strips 100Y are disposed in the grooves 102 of the substrate 100 individually. The second axial electrode strips 100X are disposed on the first surface 100A of the substrate 100 and arranged to intersect with the first axial electrode strips 100Y. The insulating layer 118 fills in the grooves 102 and is disposed at the intersection of the first axial electrode strips 100Y and the second axial electrode strips 100X for electronically isolating the plurality of first axial electrode strips 100Y from the plurality of second axial electrode strips 100X.

Referring to FIG. 4, from a top view, the plurality of first axial electrode strips 100Y are arranged along a first axis, for example the Y-axis. Each of the first axial electrode strips 100Y includes a plurality of first conductive units 112 and a plurality of first connection lines 112C for connecting any two adjacent first conductive units 112 together. The plurality of second axial electrode strips 100X are arranged along a second axis, for example the X-axis. Each of the second axial electrode strips 100X includes a plurality of second conductive units 114 and a plurality of second connection lines 114C for connecting any two adjacent second conductive units 114 together. The first axial electrode strips 100Y are arranged to intersect with the second axial electrode strips 100X, preferably the first axial electrode strips 100Y and the second axial electrode strips 100X are perpendicular to each other, but are not limited thereto.

The insulating layer 118 is disposed between the first axial electrode strips 100Y and the second axial electrode strips 100X. Actually, the insulating layer 118 is disposed on the first connection lines 112C. Specifically, the insulating layer 118 is disposed between the first connection lines 112C of the first axial electrode strips 100Y and the second connection lines 114C of the second axial electrode strips 100X to avoid shorts occurring at the intersections of the first axial electrode strips 100Y and the second axial electrode strips 100X.

Referring to FIG. 5, the substrate 100 has a second surface 100B opposite to the first surface 100A. The second surface 100B of the substrate 100 can be the outside of a touch panel which is used as the touch side of the touch panel. The substrate 100 may be a glass substrate or a plastic substrate, which can be used as a cover lens of the touch panel. In another embodiment, the substrate 100 can be used as a carrier for supporting the first axial electrode strips 100Y and the second axial electrode strips 100X. A cover lens (not shown) is further provided to cover the first axial electrode strips 100Y and the second axial electrode strips 100X. The cover lens is used as the touch side of the touch panel.

A plurality of grooves 102 are formed on the first surface 100A of the substrate 100. Referring to FIG. 4, in an embodiment, each groove 102 is disposed corresponding to each of the first axial electrode strips 100Y and the insulating layer 118 on the first axial electrode strip 100Y. From a top view, the grooves 102 just require accommodating only the first axial electrode strip 100Y and the insulating layer 118. Therefore, in an embodiment, the grooves 102 have a plane pattern which is the same as, and overlapping with, the plane pattern of the first axial electrode strip 100Y and the plane pattern of the insulating layer 118. Moreover, the area of the grooves 102 may be equal to or greater than the sum of the area of the first axial electrode strip 100Y and the area of the insulating layer 118. Furthermore, in an embodiment, the cross-sectional shape of each grooves 102 may be a rectangle. The grooves 102 in the substrate 100 have a depth D of about 1 µm. However, the plane pattern and the cross-sectional shape of the grooves 102 are not limited to the above shapes.

In the embodiment, the plurality of first conductive units 112 and the plurality of first connection lines 112C of the first axial electrode strip 100Y are disposed in the grooves 102. The insulating layer 118 fills in the grooves 102 and is disposed on the first connection lines 112C. The insulating layer 118 fills in the grooves 102 to have a height, level with the first surface 100A of the substrate 100. The plurality of second conductive units 114 of the second axial electrode strip 100X are disposed on the first surface 100A of the substrate 100. Moreover, the plurality of second connection lines 114C of the second axial electrode strip 100X are disposed on the insulating layer 118.

In the embodiment, the second connection lines 114C for connecting two adjacent second conductive units 114 together are flatly disposed on the insulating layer 118. Moreover, all the second connection lines 114C and all the second conductive units 114 are located on the same level. Thus, the second connection line 114C can electrically connect any two adjacent second conductive units 114 together without climbing across the insulating layer 118 having a protuberant height. Therefore, the second connection line 114C does not have the problems of breakage or cracking which are produced due to a connection line climbing onto the insulating layer 118 having the protuberant height. Furthermore, it can enhance uniformity of resistivity, a resistance to static and the reliability of the touch-sensor structures in the touch panel.

Figure 6A:
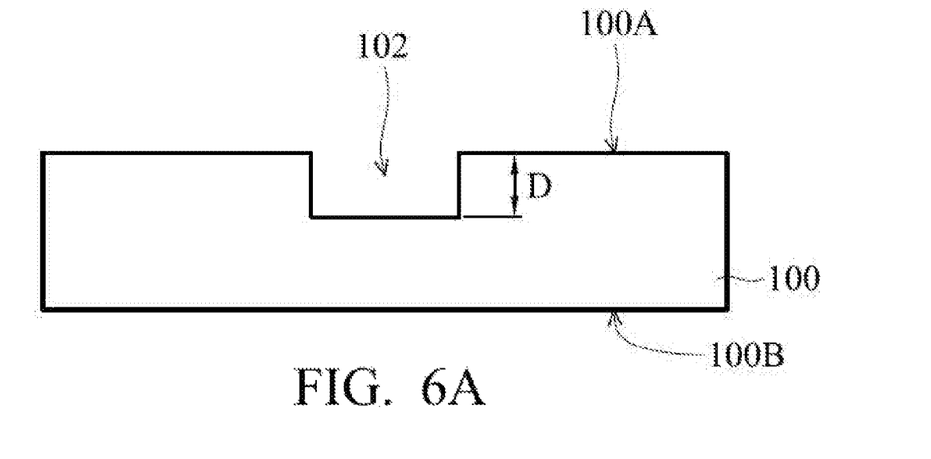
FIGS. 6A-6C show illustrative cross sections of intermediate stages of forming the touch-sensor structure of FIG. 5, according to an embodiment of the present disclosure.
Figure 6B:
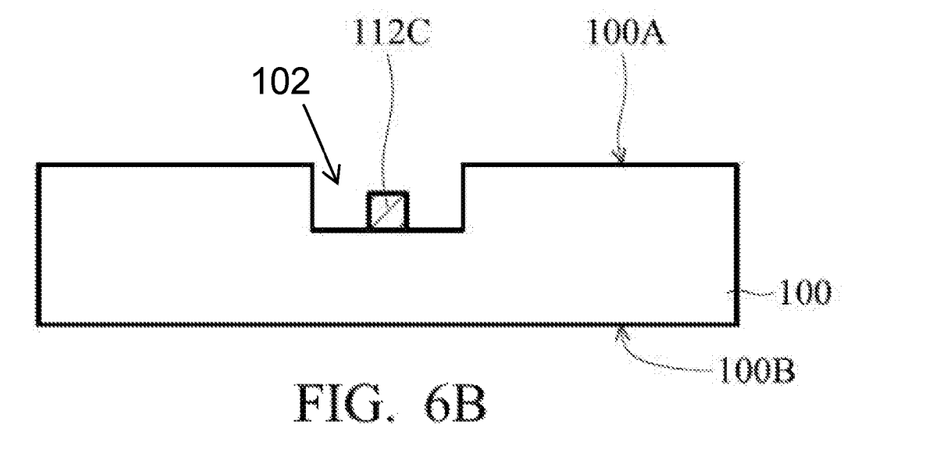
Figure 6C:
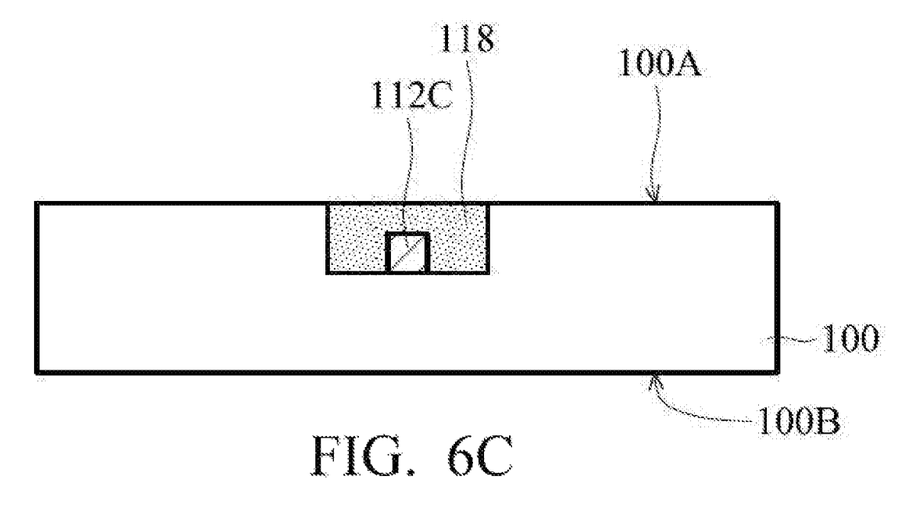

FIGS. 6A-6C show cross sections of intermediate stages of forming the touch-sensor structure of FIG. 5 according to another embodiment of the present disclosure. Referring to FIG. 6A, firstly, a plurality of grooves 102 are formed on the first surface 100A of the substrate 100. For simplifying the drawings, only one groove 102 is shown in FIG. 6A as representative. The grooves 102 are formed corresponding to the location of the first axial electrode strip 100Y and the insulating layer 118. The material of the substrate 100 and the method of forming the grooves 102 are the same as the description of FIG. 3A.

Referring to FIG. 6B, the plurality of first conductive units 112 and the plurality of first connection lines 112C for electrically connecting any two adjacent first conductive units 112 of the first axial electrode strip 100Y are formed in the grooves 102 of the substrate 100. The first conductive units 112 and the first connection lines 112C may be formed as an integral whole. The material of the first axial electrode strip 100Y is a transparent conductive material, for example indium tin oxide (ITO), indium zinc oxide (IZO), aluminum zinc oxide (AZO), or another suitable transparent conductive material. The first conductive units 112 and the first connection lines 112C of the first axial electrode strip 100Y can be formed by a deposition process, a photolithography process, and an etching process.

Referring to FIG. 6C, the grooves 102 of the substrate 100 are filled with an insulating layer 118. The insulating layer 118 fills in the grooves 102 to have a height, level with the first surface 100A of the substrate 100. Moreover, the insulating layer 118 is formed on the plurality of first connection lines 112C of the first axial electrode strip 100Y. The material and the method of forming the insulating layer 118 are the same as the description of FIG. 3C.

Then, the plurality of second conductive units 114 and the plurality of second connection lines 114C for electrically connecting any two adjacent second conductive units 114 of the second axial electrode strip 100X are formed on the first surface 100A of the substrate 100 and on the insulating layer 118. The second conductive units 114 and the second connection lines 114C can be formed as an integral whole. The second axial electrode strips 100X and the first axial electrode strips 100Y are arranged to intersect with each other. The second conductive units 114 are disposed on the first surface 100A of the substrate 100. The second connection lines 114C are disposed on insulating layer 118. Thus, the touch-sensor structure of FIG. 5 is completed. The insulating layer 118 is formed at the intersections of the first axial electrode strips 100Y and the second axial electrode strips 100X for electronically isolating the plurality of first axial electrode strips from the plurality of second axial electrode strips. Actually, the insulating layer 118 is formed between the first connection lines 112C and the second connection lines 114C for electronically isolating the first connection lines 112C and the second connection lines 114C. Furthermore, the insulating layer 118 is located between any two adjacent second conductive units 114. The second conductive units 114 and the second connection lines 114C of the second axial electrode strips 100X are made of a transparent conductive material, for example indium tin oxide (ITO), indium zinc oxide (IZO), aluminum zinc oxide (AZO), or another suitable transparent conductive material. The second conductive units 114 and the second connection lines 114C of the second axial electrode strips 100X can be formed by a deposition process, a photolithography process and an etching process. In the embodiment of FIG. 5, the first axial electrode strips 100Y and the second conductive units 114 of the second axial electrode strips 100X are respectively formed by different steps.

In the above mentioned embodiments, the first axial electrode strips 100Y are disposed in the grooves 102 of the substrate 100. However, the invention is not limited thereto. In other embodiments, the second axial electrode strips 100X can be disposed in the grooves 102 of the substrate 100 and the first axial electrode strips 100Y can be disposed on the first surface 100A of the substrate 100.

According to the touch-sensor structures of the embodiments, the insulating layer is disposed in the grooves of the substrate to make the jumpers or the connection lines for electrically connecting any two adjacent conductive units of one axial (for example a Y-axial or an X-axial) electrode strip to be flatly disposed on the insulating layer. Thus, the jumpers or the connection lines can electrically connect any two adjacent conductive units together without climbing across the insulating layer having the protuberant height. Therefore, the jumpers or the connection lines of the touch-sensor structure do not have the problems of breakage or cracking which are produced due to the jumpers or the connection lines climbing onto a protuberant insulating layer. Furthermore, uniformity of resistivity, a resistance to static and the reliability of the touch-sensor structures in the touch panel are enhanced.

While certain embodiments have been shown and described, various modifications and substitutions may be made thereto without departing from the spirit and scope of the disclosure. Therefore, it is to be understood that the present disclosure has been described by way of illustration and not limitations.

What is claimed is:
1. A touch-sensor structure, comprising:
 a substrate having a plurality of grooves disposed on a surface of the substrate;
 a plurality of first axial electrode strips individually disposed in the grooves of the substrate;

a plurality of second axial electrode strips disposed on the surface of the substrate and intersecting with the first axial electrode strips; and a plurality of insulating layers, wherein the insulating layers are separately disposed in the grooves for partially covering the first axial electrode strips, and wherein the insulating layers are located at intersections of the first axial electrode strips and the second axial electrode strips for isolating the plurality of first axial electrode strips from the plurality of second axial electrode strips, wherein each of the second axial electrode strips comprises a plurality of second conductive units and a plurality of jumpers for electrically connecting adjacent second conductive units, and wherein each of the insulating layers has a top surface, the top surface is level with a surface of the second conductive units to form a planar surface, and the jumpers are formed on the planar surface.

2. The touch-sensor structure of claim 1, wherein each of the first axial electrode strips comprises a plurality of first conductive units and a plurality of first connection lines for electrically connecting the adjacent first conductive units, wherein each of the insulating layers is disposed on a corresponding first connection line, and wherein each of the jumpers is disposed on a corresponding insulating layer of the insulating layers.

3. The touch-sensor structure of claim 1, wherein the jumpers comprise a metal or a transparent conductive material.

4. The touch-sensor structure of claim 1, wherein the first axial electrode strips and the second axial electrode strips comprise a transparent conductive material.

5. The touch-sensor structure of claim 1, wherein the grooves have a plane pattern the same as and overlapped with a plane pattern of the first axial electrode strips and a plane pattern of the insulating layers.

6. The touch-sensor structure of claim 1, wherein each of the grooves has a cross-sectional shape comprising a rectangle.

7. A touch-sensor structure, comprising:
a substrate having a plurality of grooves disposed on a surface of the substrate;
a plurality of first axial electrode strips individually disposed in the grooves of the substrate;
a plurality of second axial electrode strips disposed on the surface of the substrate and intersecting with the first axial electrode strips; and
a plurality of insulating layers, wherein the insulating layers are separately disposed in the grooves for partially covering the first axial electrode strips, and wherein the insulating layers are located at intersections of the first axial electrode strips and the second axial electrode strips for isolating the plurality of first axial electrode strips from the plurality of second axial electrode strips, wherein each of the insulating layers has a top surface, the top surface is level with the surface of the substrate to form a planar surface, and the second axial electrode strips are formed on the planar surface.

8. The touch-sensor structure of claim 7, wherein each of the first axial electrode strips comprises a plurality of first conductive units and a plurality of first connection lines for electrically connecting adjacent first conductive units, wherein each of the insulating layers is disposed on a corresponding first connection line, wherein each of the second axial electrode strips comprises a plurality of second conductive units and a plurality of second connection lines for electrically connecting adjacent second conductive units, and wherein each of the second connection lines is disposed on a corresponding insulating layer of the plurality of insulating layers.

9. The touch-sensor structure of claim 7, wherein the first axial electrode strips and the second axial electrode strips comprise a transparent conductive material.

10. A manufacturing method of a touch-sensor structure, comprising:
forming a plurality of grooves on a surface of a substrate;
forming a plurality of first axial electrode strips individually located in the grooves;
forming a plurality of insulating layers, wherein the insulating layers are separately disposed in the grooves for partially covering the first axial electrode strips; and
forming a plurality of second axial electrode strips on the surface of the substrate to intersect with the first axial electrode strips, wherein the insulating layers are located at intersections of the first axial electrode strips and the second axial electrode strips for isolating the plurality of first axial electrode strips from the plurality of second axial electrode strips, wherein each of the insulating layers has a top surface, the top surface is level with the surface of the substrate to form a planar surface, and the second axial electrode strips are formed on the planar surface.

11. The method of claim 10, wherein each of the first axial electrode strips comprises a plurality of first conductive units and a plurality of first connection lines for electrically connecting adjacent first conductive units, wherein each of the second axial electrode strips comprises a plurality of second conductive units and a plurality of second connection lines for electrically connecting adjacent second conductive units, wherein the first conductive units and the first connection lines are formed simultaneously, wherein the second conductive units and the second connection lines are formed simultaneously, and wherein each of the insulating layers is formed between a corresponding first connection line and the second connection line.

12. The method of claim 10, wherein the substrate comprises glass and the grooves are formed by a micro-etching process or a laser-engraving process.

13. The method of claim 10, wherein the substrate comprises plastic and the grooves are formed by an imprinting process.

14. A manufacturing method of a touch-sensor structure, comprising:
forming a plurality of grooves on a surface of a substrate;
forming a plurality of first axial electrode strips individually located in the grooves;
forming a plurality of insulating layers, wherein the insulating layers are separately disposed in the grooves for partially covering the first axial electrode strips; and
forming a plurality of second axial electrode strips on the surface of the substrate to intersect with the first axial electrode strips, wherein the insulating layers are located at intersections of the first axial electrode strips and the second axial electrode strips for isolating the plurality of first axial electrode strips from the plurality of second axial electrode strips, wherein each of the second axial electrode strips comprises a plurality of second conductive units and a plurality of jumpers for electrically connecting adjacent second conductive units, and wherein each of the insulating layers has a top surface, the top surface is level with a surface of the second conductive units to form a planar surface, and the jumpers are formed on the planar surface.

15. The method of claim 14, wherein the substrate comprises glass and the grooves are formed by a micro-etching process or a laser-engraving process.

16. The method of claim 14, wherein the substrate comprises plastic and the grooves are formed by an imprinting process.

17. The method of claim 14, wherein each of the first axial electrode strips comprises a plurality of first conductive units and a plurality of first connection lines for electrically connecting adjacent first conductive units, and wherein the first axial electrode strips and the second conductive units are formed simultaneously.

18. The method of claim 17, wherein each of the insulating layers is formed between a corresponding first connection line and jumper.

19. The touch-sensor structure of claim 7, wherein the grooves have a plane pattern the same as and overlapped with a plane pattern of the first axial electrode strips and a plane pattern of the insulating layers.

\* \* \* \* \*

UNITED STATES PATENT AND TRADEMARK OFFICE
CERTIFICATE OF CORRECTION

PATENT NO. : 9,456,493 B2  
APPLICATION NO. : 14/064183  
DATED : September 27, 2016  
INVENTOR(S) : Qiong Yuan et al.

Page 1 of 1

It is certified that error appears in the above-identified patent and that said Letters Patent is hereby corrected as shown below:

In the Specification

Column 3, Line 44, please delete "the second compartment portion 102B".

In the Claims

Column 9, Line 23, Claim 2, please delete "the".

Signed and Sealed this
Thirtieth Day of May, 2017

Michelle K. Lee
*Director of the United States Patent and Trademark Office*